United States Patent [19]
Kmetz

[11] 3,931,510
[45] Jan. 6, 1976

[54] EQUALIZATION STORAGE IN RECIRCULATING MEMORIES

[75] Inventor: Allan R. Kmetz, Richardson, Tex.

[73] Assignee: Texas Instruments Incorporated, Dallas, Tex.

[22] Filed: July 12, 1974

[21] Appl. No.: 487,104

[52] U.S. Cl............ 235/193; 307/221 D; 333/70 T; 340/173 RC
[51] Int. Cl.²................ G11C 11/40; H03K 5/159
[58] Field of Search......... 235/193, 152; 307/221 R, 307/221 C, 221 D, 304; 333/18, 28, 70 T; 357/24; 340/173 R, 173 RC; 328/167

[56] References Cited
UNITED STATES PATENTS

| | | |
|---|---|---|
| 3,474,260 | 10/1969 | Frohbach............................ 307/221 |
| 3,746,883 | 7/1973 | Kovac............................ 307/221 D |
| 3,775,685 | 11/1973 | Eggimann et al................. 333/18 X |
| 3,809,923 | 5/1974 | Esser............................... 307/221 D |
| 3,819,958 | 6/1974 | Gosney........................ 307/221 D X |

*Primary Examiner*—Joseph F. Ruggiero
*Attorney, Agent, or Firm*—Harold Levine; James T. Comfort; Gary C. Honeycutt

[57] ABSTRACT

A dispersion compensated CTD controlled data display where a serial-parallel-serial CTD is loaded at a low data rate with clock means to shift data from the CTD at a high data rate. A transversal filter is connected in series with the CTD to provide a dispersion corrected output of the data. The output is applied to the input of the CTD at the high data rate and to a display unit with reloading of the CTD to change the display.

13 Claims, 6 Drawing Figures

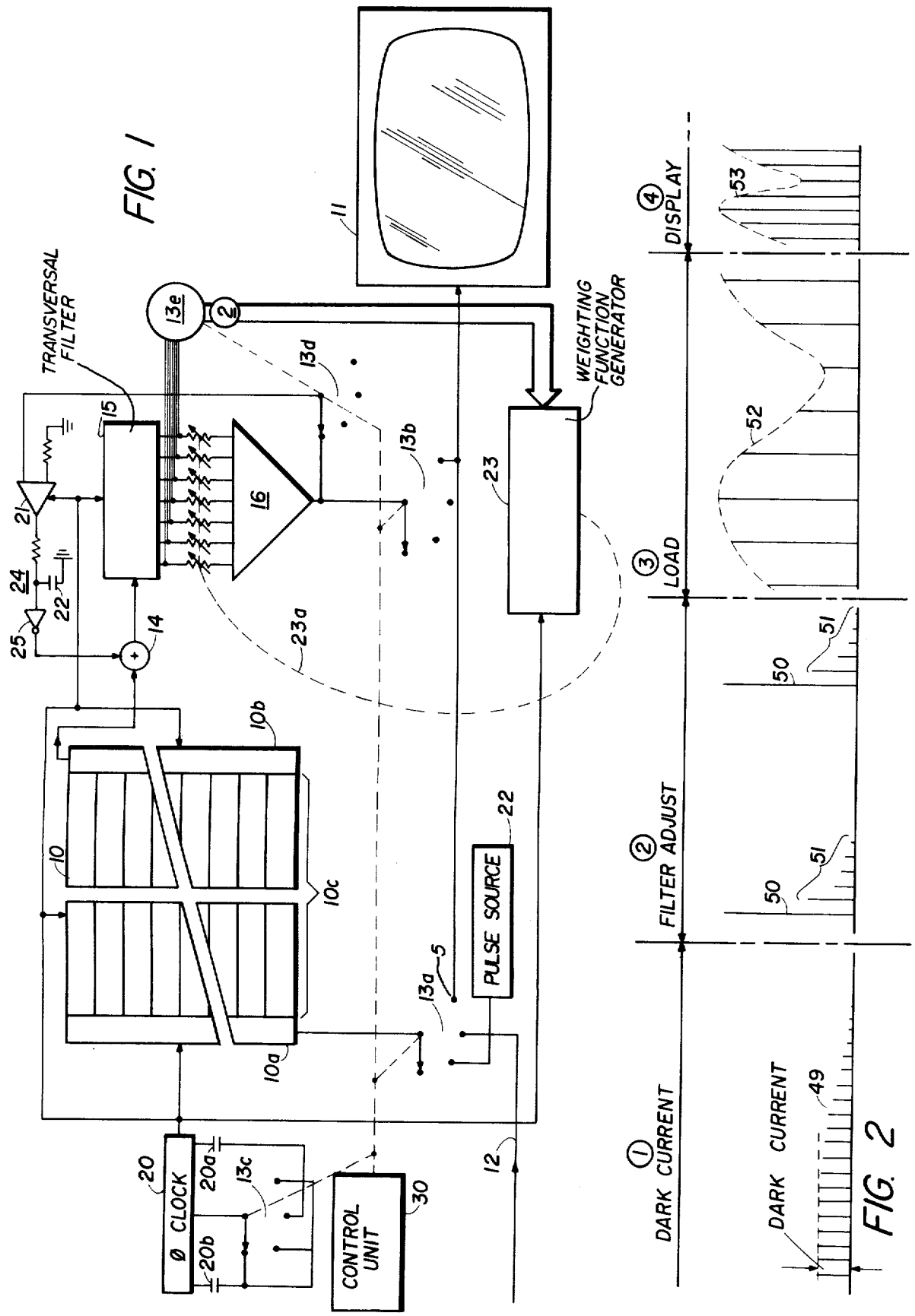

EQUALIZATION STORAGE IN RECIRCULATING MEMORIES

This invention relates to recirculation of information in charge transfer devices with compensation for dispersion.

BACKGROUND OF THE INVENTION

Charge coupled devices, hereafter referred to as CCDs and bucket brigade devices (BBDs) are both charge transfer devices (CTD) capable of handling analog information. Continuous recirculation is required for long term memories. As is known, upon each transfer of a given charge packet, a small amount of charge is left behind. The amount depends upon the charge transfer efficiency of each device. This action progressively diminishes the amplitude of the original charge packet and erroneously increases the charge in subsequent packets. Therefore, since charge transfer efficiency is not perfect, analog information becomes smeared out along the device. In addition to dispersion distortion, a constant accumulation of dark current will eventually saturate all of the packets. Thus, simple recirculation of analog information in an analog CCD shift register normally fails because of the amplitude and phase distortion due to transfer inefficiency and the accumulation of dark current.

Dispersion effects can be compensated by use of a transversal filter. Losses and the distortion of information in the shift register may be compensated by use of a series transversal filter. The transfer function H(eq) for the equalization may be expressed in terms of a gain factor and a phase factor proportional to the charge transfer inefficiency:

$$H(\text{eq}) = \beta \exp\left[ n \, \epsilon \left(1 - \cos 2 \frac{\pi f}{fc}\right)\right]$$

where
- $\beta$ is a gain factor,
- $\epsilon$ is transfer inefficiency,
- $n$ is the number of transfers in the CCD,
- $fc$ is the clock frequency, and
- $f$ is the frequency of the analog signal sampled and applied to the CCD input.

As to dark current, the charge in each packet contributed thereby is temperature dependent, doubling in magnitude in typical devices for each 10°C change. Dark current may be compensated by a shift in the D.C. level of the signal. However, both the dispersion effect and the dark current effect cannot be compensated simply by gain.

SUMMARY OF THE INVENTION

To evaluate dispersion distortion, a known signal such as an impulse is inserted to the CTD input and the output monitored as dispersion is adjusted to obtain an impulse out. Dark current compensation is adjusted to remove any level shift from input to output.

In obviating manual adjustments and to compensate for changes with operation conditions such as temperature, a transversal filter preferably employed is an adaptive equalizer in which the CTD input periodically is connected to a known signal such as impulse of known amplitude. The output is used to set the tap weights of the transversal filter. Closed loop adjustment of the dark current compensation also is provided. Thereafter, normal operation provides compensated storage of analog information.

In accordance with the invention, a dispersion compensated CTD controlled data display system is provided wherein a serial-parallel-serial CTD is loaded with data under control of clock means which is also operable to shift data from the CTD at a high data rate. An adaptive transversal filter is connected in series with the CTD to provide a dispersion corrected output of the data from the CTD. The filter output is applied to the input of the CTD and to a display unit. Means are provided periodically to relaod the CTD.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

FIG. 1 is a diagram of a CCD display system embodying the invention;

FIG. 2 illustrates waveforms from FIG. 1;

DESCRIPTION OF THE PREFERRED EMBODIMENTS

Figure 3:
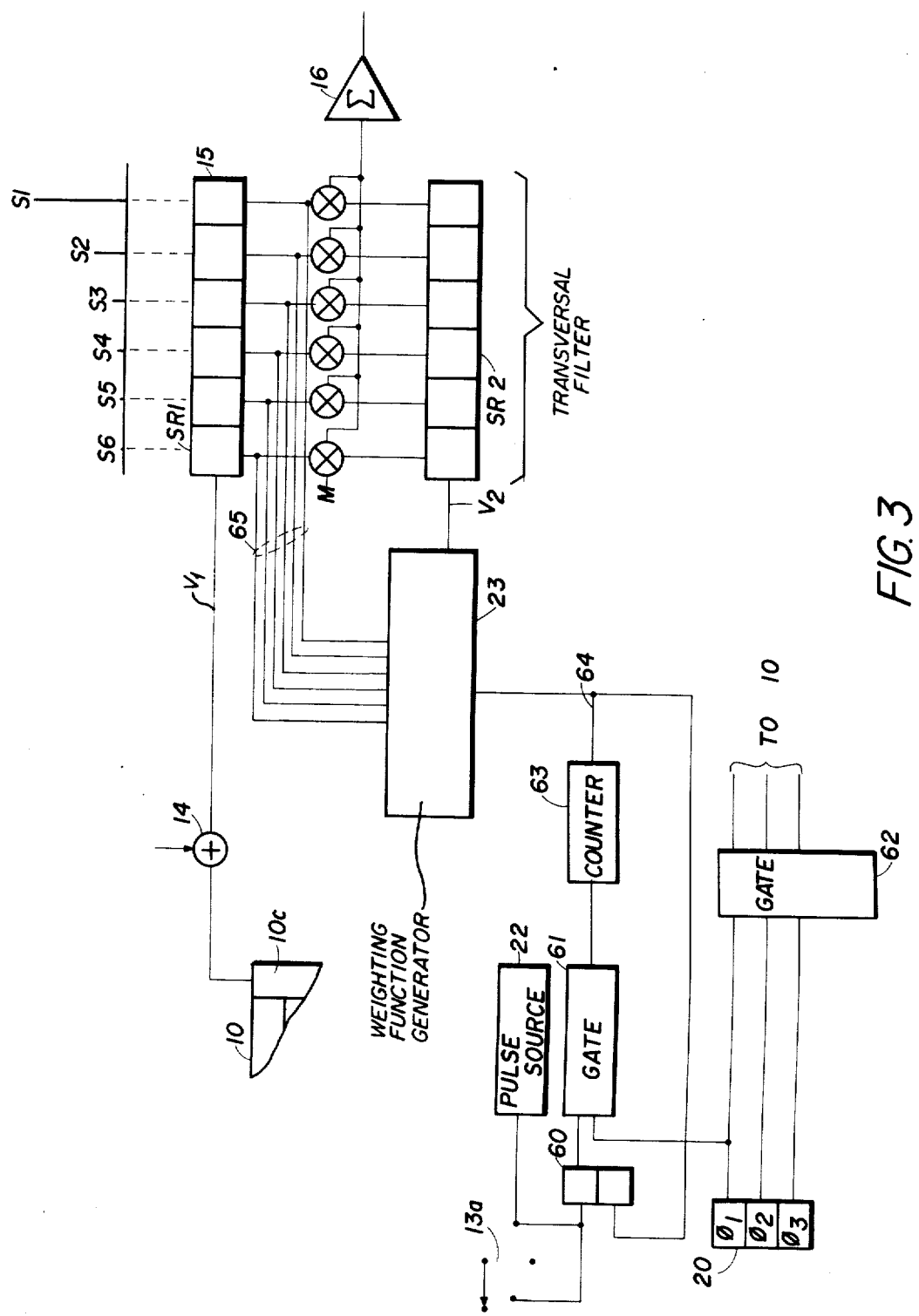
FIG. 3 is a block diagram of the system using a variable tap weight convolution filter for automatic dispersion correction.

As set forth above, the present invention employs charge transfer devices, which include charge coupled devices and bucket brigade devices, for compensating for dispersion, utilizing a transversal filter having variable tap weights. CTD devices are used as shift registers. One shift register functions to store tap weights from a control signal, and another shift register for receiving the signal to be compensated for dispersion.

In general a CCD stores charges in potential wells, beneath electrodes at and insulated from a semiconductor surface, moving these wells from electrode to electrode in order to transfer the charge with the resulting shift register function occurring.

A BBD commonly comprises a row of insulated gate field effect transistors (IGFETs) having their channels in series and storage capacitance provided between the gate and the drain of each transistor. In integrated circuit form, a common doped region provides the drain for one transistor and the source for the next succeeding transistor, as well as providing an interconnection between them. The gate electrodes of the transistors are extended to overlap the respective drain regions sufficiently to provide the required gate-drain capacitances. The BBD transfers charge by providing a potential difference between storage capacitors at the site from which and the site to which the charge is to be transferred. When the potential difference is large enough the charge transfers from one capacitor to the next.

It is understood that any combination of CCD's or BBD's may be used in the present invention.

Essentially a device according to the present invention is illustrated by the block diagram of FIG. 1. FIG. 1 illustrates use of a serial-parallel-serial CCD 10 having serial input sections 10a and 10b, and a parallel section 10c; in a display system employing a cathode ray tube 11. Normally, strings of data are delivered to the CCD 10 by way of a low bandwidth low data rate input line 12. For example, data on telephone lines may be of the order of 1,000 to 2,000 bits per second. In contrast, the display 11 utilizes data at the rate of about four mega bits per second. By the present invention provision is made for refresh and display of the data utilizing a CCD 10.

Input line 12 is connected by way of an input selector shown in the form of a switch 13a to supply data to the serial input section 10a of CCD 10. Output section 10c is connected by way of a summing unit 14 to a transversal filter 15. A plurality of output taps of filter 15 are of adjustable weights and are connected to the inputs of a summing amplifier 16. Filter 15 with weighted outputs has an impulse response the inverse of the dispersion in CCD 10. The output of amplifier 16 is connected by way of a switch 13b to terminal 5 of switch 13a.

CCD 10 is driven from a clock source 20. Source 20 is a multi phase generator having an output pulse rate selector switch 13c. Capacitors 20a and 20b represent frequency controlling elements in source 20. Capacitor 20a, when effective in the source circuit causes an output at a low rate, capacitor 20b at a high rate. CCD 10 operates at the low data rate harmonius with the data flow over line 12 and at a high rate harmonius with the requirements of display unit 11 when the clock source 20 is controlled by capacitors 20a and 20b, respectively. Source 20 is connected not only to the sections 10a, 10b and 10c of the CCD 10, but also to the transversal filter 15, to a differential amplifier 21, to a pulse source 22 and to a weighting unit 23 which is adapted to adjust the transversal filter output.

Switch 13d serves to connect the output of amplifier 16 to the input of differential amplifier 21. The output of amplifier 21 is connected to an integrator 24 and thence by way of an inverter 25 to the second input of the summing unit 14 to cancel dark current.

The waveforms of FIG. 2 have been illustrated to show the inputs from switch 13a to the CCD 10 for each of the four positions.

In switch position 1, no data is input to the CCD 10 while operating under the control of the clock pulses from source 20 at the high rate. Dark current output will be sampled. The magnitude of the dark current is indicated by the magnitude of the output samples represented by curve 49a FIG. 2. This voltage then accumulates on a capacitor 22 to adjust an output to be applied to summation unit 14 to reduce the dark current component of the CCD output to zero.

More particularly the output dark current 49 of CCD 10 is sensed by the differential amplifier 21. A voltage is stored on capacitor 22 in integrator 24 which is proportional to the dark current generated in the CCD 10. This is proportional to the amplitude of the output 49, FIG. 2. The voltage from integrator 24 is then inverted in unit 25 and applied to summation unit 14 and is thus held at this level until switches 13a-e are again in position 1. Thus, the dark current is compensated reducing the output of the transversal filter 15 to zero level for zero signal input.

In switch position 2, widely spaced pulses 50 are applied to the input of the CCD 10. As the pulse is shifted through the CCD, a trailing series 51 are left behind by reason of poor transfer efficiency. In switch position 2, the outputs of the register 15 are applied to unit 23 automatically to adjust, by way of linkage 23a, the magnitudes or levels of resistances coupling the transversal filter output to the summing amplifier 16. Basically, the outputs from unit 15 are multiplied by a weighting factor so that the output of the CCD 10 will be fully restored, i.e., pulse 50 will be restored and trailing packets reduced to zero. The trailing packets are modified and summed in unit 16 with suitable weighting.

In switch position 3, the input signal in the form of sample pulses 52a appears on line 12. This signal is applied through switch 13a to CCD 10. Clock source 20 shifts the data at a rate compatible with the input data on line 12, i.e., at a much lower rate. This operation continues until CCD 10 is loaded.

In switch position 4, the system again operates at the high clock rate. Signal output pulses 53 of amplifier 16 are applied to display unit 11 and through switch 13a to the input to CCD 10 so that the data is circulated and constantly refreshed rendered free from dispersion effects.

In one aspect of the invention, switches 13a-e are controlled by a control unit 30 which may be a conventional multi-position control switch. While switches 13a-e have been shown in conventional form, they preferably are active circuit devices such as are well known. Gated field effect transistors, for example, would be preferred. In this case, the control unit 30 may comprise a transistor logic switch arrangement for applying gating pulses to operate appropriate ones of the field effect transistors. FIG. 1 has been shown to protray the funtion.

CCD 10 and the filter 15 together with the amplifier 16 and the weighted resistors may be incorporated on a single semiconductor chip. The weights for filter 15 in accordance with one aspect of the invention may be precalculated and preset. In such case, the filter 15 would not be an active filter but would be constructed to have set impulse response which is the inverse of the dispersion.

In executing the invention, with particular reference to large size integrated circuit system, MOS devices preferably will be employed. The manner in which such devices would be implemented is illustrated in FIGS. 3 and 4 with appropriate voltage waveforms being shown in FIG. 5.

Referring to FIG. 3, two charge transfer device shift registers SR1 and SR2 are provided; these may both be CCD or BBD shift registers; alternatively one may be a CCD and the other a BBD shift register. Analog signals $V_1$ and $V_2$ are sampled and clocked into shift register SR1 and SR2 respectively and propagated along those shift registers in conventional manner. The sampled values of $V_2$ provide tap weights for the transversal filter operation to be performed. Signal levels stored at corresponding stages of each shift register are non-destructively detected and applied as inputs to multipliers M which provide outputs proportional to the products of the sampled values at each shift register stage. The outputs of the multipliers M are simultaneously summed or accumulated by a summation amplifier 16 to provide a convolved output signal. The outputs from register SR2 are weighting functions and are adjusted while switch 13e is in switch position 2 and remain constant for all other operations.

Referring further to FIG. 3, the pulse source 22 is connected to switch position 2 of switch 13a to apply a single isolated pulse 50 (FIG. 2) to CCD 10. At the same time, pulse 50 is applied to a flip-flop 60 to enable a gate 61. The outputs of the clock source 20 are connected to a gate 62. The $\phi_1$ output is connected through gate 61 to a counter 63. Counter 63 is preset to a count equal to the number of cells in CCD 10 plus the six cells in filter 15. When counter 63 reaches this count, an output state appears on the output channel 64. This is connected back to reset flip-flop 60 to disable gates 61 and 62. It is also applied as an enable signal to the weighting generator unit 23. The six outputs from SR1 are applied by way of channels 65 to the unit 23 causing the five analog weighting functions to appear as $V_2$ samples on the input to the SR2 register. The latter samples are clocked into SR2 register where they are held for nondestructive sampling in the application to the multipliers M.

Figure 5:
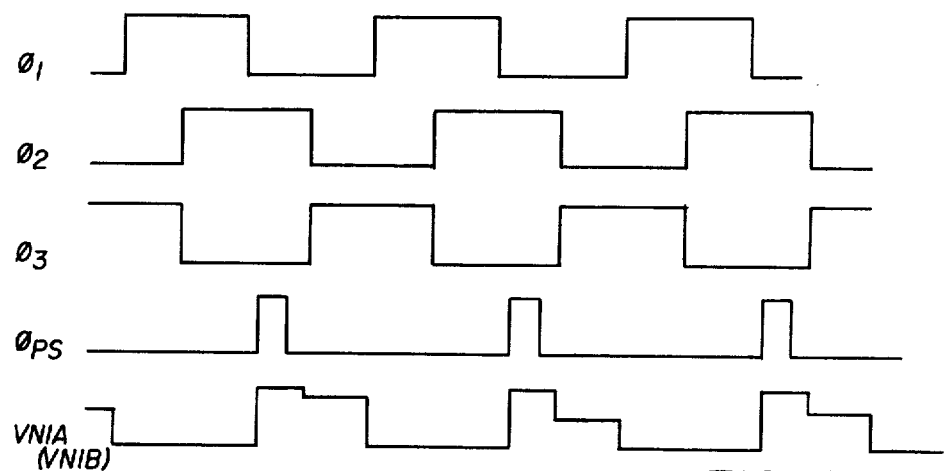
FIG. 5 illustrates waveforms used in the system of FIG. 4.
Figure 4:
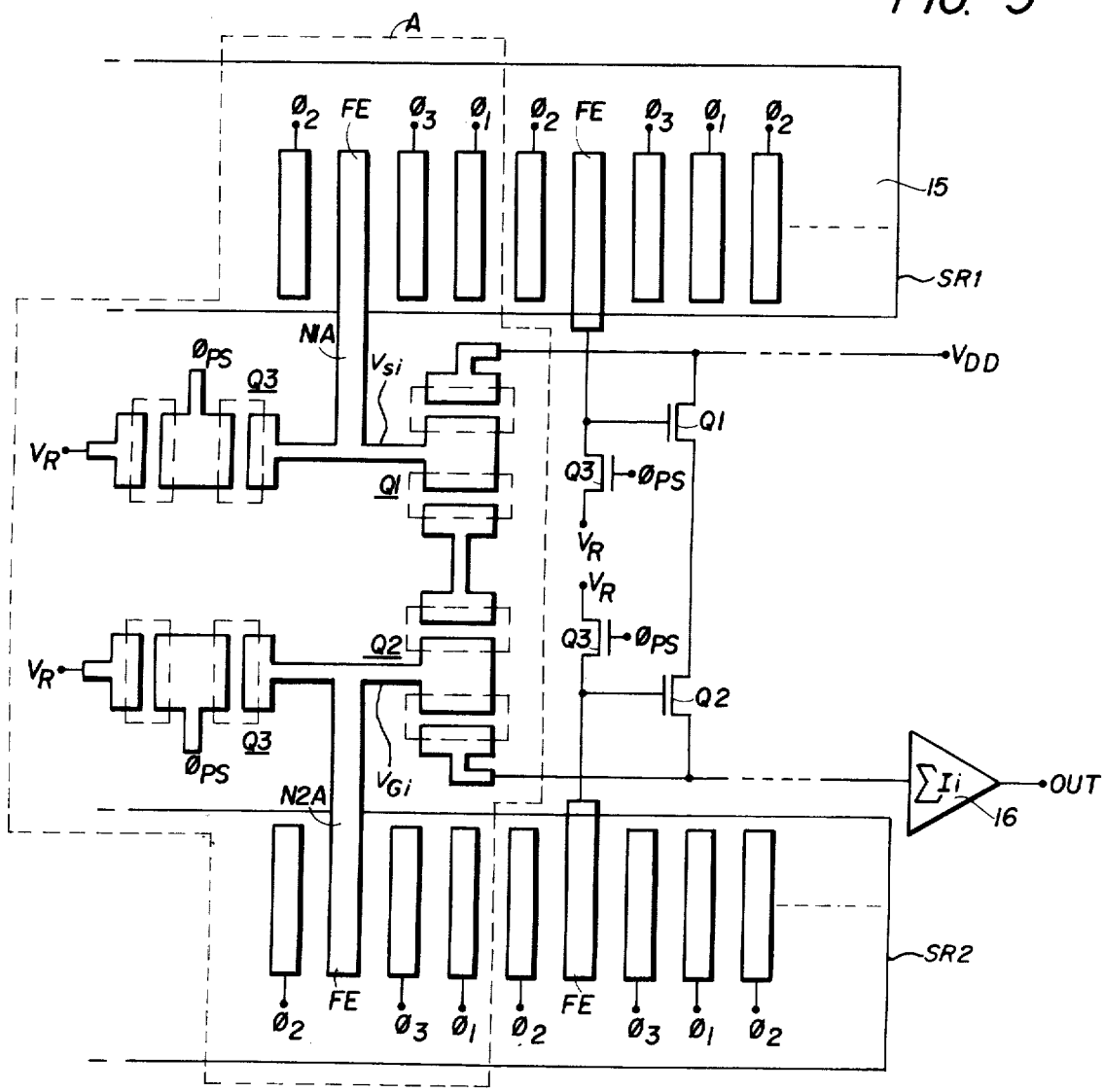
FIG. 4 is a schematic diagram of a charge coupled device shift register with means for compensating the output of the charge coupled device.

FIG. 4 illustrates in greater detail a portion of a system as shown in FIG. 3 using CCD shift registers SR1 and SR2. Associated clock pulse timing diagrams are illustrated by FIG. 5. The CCD shift registers SR1 and SR2 are illustrated in FIG. 3 as 3-phase registers with the transfer electrodes connected to clock pulse phase lines as shown. However, any polyphase CCD shift register system could be used, the choice being determined by the particular application involved. In both shift registers, each stage incorporates a floating gate amplifier for non-destructive detection or sampling of the signal level stored at that stage. Thus, in each stage of the shift registers SR1 and SR2, a floating electrode FE (i.e., an electrode not connected to a clock pulse phase) is located between the $\phi_2$ and $\phi_3$ phase transfer electrodes. Considering the A components of SR1 and SR2, the floating electrodes FE thereof are connected to (or extended to form) the gate electrodes of respective IGFETs $Q_1$ and $Q_2$, the source of transistor $Q_1$ being connected to the drain of transistor $Q_2$ with an output taken from the source of transistor $Q_2$ so that transistors $Q_1$ and $Q_2$ function as a source follower amplifier. Respective preset IGFET transistors $Q_3$ have their drains connected to the gates of transistors $Q_1$ and $Q_2$, the gate of each transistor $Q_3$ being connected to receive preset pulses PS. For clarity, FIG. 4 illustrates a structural configuration and a circuit schematic for the floating gate amplifier just described.

The drain of transistor $Q_1$ of all the stages of the shift register SR1 are connected to a common drain supply $V_{DD}$ while the sources of transistors $Q_2$ of all the stages of shift register SR2 are connected as a common input to a current summation amplifier 16 having an output terminal OUT.

Operation of the system illustrated by FIG. 4 may be explained as follows. With clock signal $\phi_2$ on, signal sample related charges are stored beneath the $\phi_2$ electrodes in shift registers SR1 and SR2. During a portion of the on period of clock pulse $\phi_2$ that does not overlap the associated $\phi_1$ pulse period, a short precharge pulse PS is applied to the gates of transistors $Q_3$ to precharge the floating gate nodes N1A and N2A of shift registers SR1 and SR2 to a predetermined voltage. When clock pulse $\phi_2$ switches to an off condition, charges corresponding to the signal levels previously stored beneath the phase $\phi_2$ electrodes are transferred to beneath the floating gate electrodes FE in the respective shift registers SR1 and SR2, giving rise to corresponding gate voltages $V_{Si}$ at transistor $Q_1$ and $V_{Gi}$ at transistor Q2.

The resulting current $I_i$ through the transistors $Q_1$ and $Q_2$ is thus proportional to the product $V_{Gi} \times V_{Si}$. The nodes N1A and N2A are subsequently reset to zero potential prior to occurrence of the next $\phi_1$ pulse.

The product currents $I_i$ for all of the stages of the shift registers are applied as a common input to the current summing amplifier 16 to produce a dispersion compensated output signal at the output terminal OUT.

In FIG. 5, the same waveform is shown for nodes N1A and N2A for the sake of simplicity; however, it will be appreciated that the actual voltages of these nodes will normally differ, depending on the respective values of signal related voltages $V_{Si}$ and $V_{Gi}$.

In place of a floating gate amplifier as described with reference to FIG. 4, a floating diffusion amplifier may be used. In that case, doped (e.g., diffused) regions would be formed in the semiconductor substrate at locations coresponding to the floating electrodes FE which would be omitted. The doped regions would extend beyond the transfer electrodes in a direction laterally of the signal propagation direction along the shift registers, and the gate electrodes of transistors $Q_1$ and $Q_2$ would be extended to ohmically connect with the corresponding doped regions in the shift registers SR1 and SR2, respectively.

Figure 6:
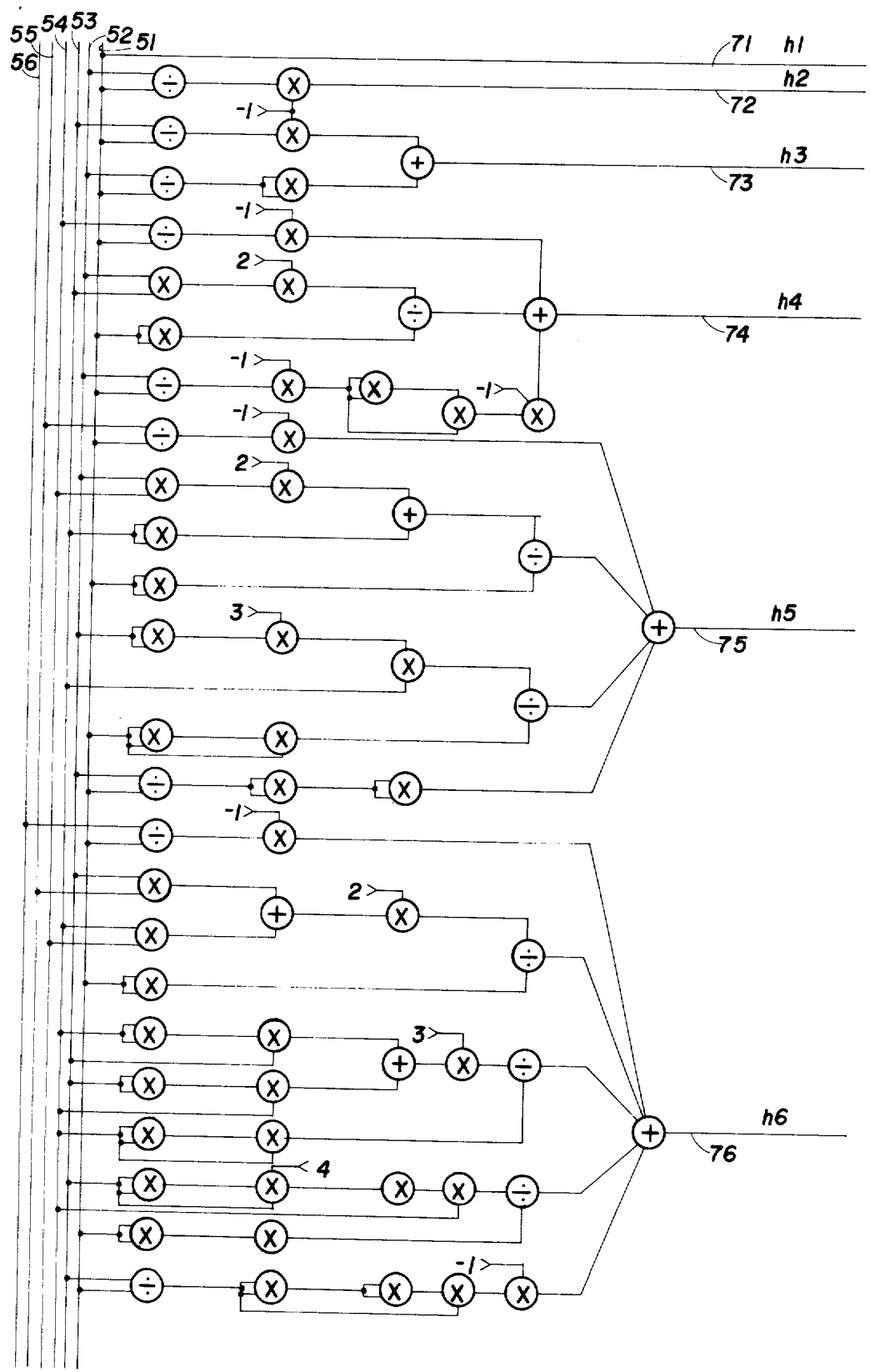
FIG. 6 is a schematic diagram showing generation of the weighting function stored in register SR2 of FIG. 3.

FIG. 6 illustrates circuitry that may be employed in the weighting function generator 23. When the enable signal on channel 64 is applied to circuit 23 (see FIG. 3), the components illustrated in FIG. 6 are activated to produce six output weighting functions $h_1-h_6$. The latter comprise the six outputs of the weighting unit 23 which are to be successively sampled and stored in register SR2, FIG. 3.

In order to provide correction for dispersion in CCD 10, it will be understood that the six output samples from filter 15 appearing on lines 65 (FIG. 3) are the samples S1, S2, S3, S4, S5 and S6. These samples are portrayed immediately above register 15 in FIG. 3. The relative amplitudes thereof as appearing at the output of amplifier 15 are applied to the circuit of FIG. 6 by way of the bus 65, as above noted. The six output weighting functions $h_1-h_6$ are then generated in accordance with the following relationships.

$$h_1 = S1 \tag{1}$$

$$h_2 = -\frac{S2}{S1} \tag{2}$$

$$h_3 = -\frac{S3}{S1} + \left(\frac{S2}{S1}\right)^2 \tag{3}$$

$$h_4 = -\frac{S4}{S1} + \frac{2\,S2\,S3}{S1^2} - \left(\frac{S2}{S1}\right)^3 \tag{4}$$

$$h_5 = -\frac{S5}{S1} + \frac{(2\,S2\,S4 + S3^2)}{S1^2} - \frac{3\,S2^2\,S3}{S1^3} + \left(\frac{S2}{S1}\right)^4 \tag{5}$$

$$h_6 = -\frac{S6}{S1} + \frac{2(S2\,S5 + S3\,S4)}{S1^2} - \frac{3(S2\,S3^2 + S2^2\,S3)}{S1^3} + \frac{4S2^3\,S3}{S1^4} - \left(\frac{S2}{S1}\right)^5 \tag{6}$$

Thus, in accordance with Equation (1), the $H_1$ output on line 71 is the unmodified amplitude of the signal S1 from the last cell of register 15.

The $h_2$ output appearing on line 72 is produced by dividing S2 by S1 and changing the sign thereon.

The $h_3$ output appearing on the channel 73 involves use of the signals S3, S2 and S1 in the relationship shown in Equation (3) and as implemented in the circuit leading to line 73.

The $h_4$ output appearing on line 74 involves utilization of the signals S1, S2, S3 and S4 in the relationship indicated in Equation (4) and as implemented in the circuitry leading to line 74.

The $h_5$ output appearing on line 75 involves measurement of the amplitudes of the signals S1–S5 in the relationship indicated in Equation (5) and implemented in the circuitry in leading to line 75.

Finally, the $h_6$ output appearing on line 76 involves utilization of all of the outputs S1–S6 in the relationship indicated in Equation (6) and implemented in the circuitry leading to line 76.

It will be appreciated that the transversal filter section 15 of the CCD is of but limited length. In the example here given, only six cells are utilized. Equations (1)–(6) are thus tailored to the six cell transversal filter. It will be appreciated that a greater number or even a fewer number than six cells may be used, in which case the same relationships as set forth in Equations (1)–(6) would apply. If a greater number of cells are employed, then the additional outputs would be multiplied by a weighting factor which includes one additional component as indicated by the pattern of successively increasing terms in the Equations (1)–(6).

Switches 13a–e may be cycled to execute the four modes shown in FIG. 2 as frequently as desired. This could be done as often as once for each load and display cycle. That is, the switches might be repeatedly actuated to run through the dark current adjustment, the filter adjustment, loading the CTD with data and then reading out the data at the high data rate for display purposes. Alternatively, the adjustment modes 1 and 2 might be done once for every 10, 100 or 1,000 or 1,000,000 cycles of mode 3 and/or 4.

The filter can be made to correct dispersion to any order in the charge loss parameter $\alpha$ ($\alpha$ = charge loss per stage). Loss per transfer may be $\alpha$ = 2 or 3 for a two or three phase charge transfer device, respectively. It can be seen, however, that a correction to the $k$th order requires tapping $k$ sequential delay stages.

The manner in which taps may be made to a transversal filter section of a CTD is described in U.S. patent application Ser. No. 320,347, filed Jan. 2, 1973, entitled "Dispersion Compensation Circuitry For Analog Charged Systems", now U.S. Pat. No. 320,347 assigned to the assignee of the present invention.

The charge coupled device may be constructed in accordance with known procedures, such as described in U.S. Pat. No. 3,756,924.

The display unit 11 may utilize sufficient data to provide a conventional TV display of 525 lines or it may utilize a CTD tailored to a more limited display of, for example, where register 10 would have 160 registers each of 100 cells.

Having described the invention in connection with certain specific embodiments thereof, it is to be understood that further modifications may now suggest themselves to those skilled in the art and it is intended to cover such modifications as fall within the scope of the appended claims.

What is claimed is:

1. In a data handling system, the combination comprising:

a. a CTD analog shift register having data input means and data output means,
   b. a CTD transversal filter section of limited length connected to the output of said analog shift register, said transversal filter section comprising a plurality of cells and tap weight means for weighting outputs from said cells by weighting functions to compensate dispersion distortion due to one pass of an analog signal through said analog shift register,
   c. linear amplifier means connected to sum weighted outputs from the cells of said transversal filter section, and
   d. means selectively operable to connect the output of said amplifier means to the data input means of said analog shift register.

2. The combination set forth in claim 1 in which:

a. means are provided periodically to apply to the data input means of said CTD shift register a known amplitude signal, and
   b. means automatically to set the tap weights of said transversal filter in accordance with the output from shift register of said known amplitude signal.

3. The combination set forth in claim 1 in which a summation means is provided in series with said CTD and said filter and means which senses dark current components in the output from said CTD and adjusts the D.C. level of said output through said summation means to eliminate the dark current component from the output of said filter.

4. The combination set forth in claim 1 in which a control means cycles said shift register successively through a filter weighting mode, a data load mode and a display mode.

5. The combination set forth in claim 4 in which said control means includes said weighting mode on selected cycles only.

6. The combination set forth in claim 4 in which said control means includes in said display mode multiple read outs from said CTD within each said cycle.

7. A dispersion compensated CTD controlled data display system which comprises:

a. a serial-parallel-serial CTD,
   b. means to load said CTD at a low data rate,
   c. clock means to shift said data from said CTD at a high data rate,
   d. an adaptive transversal filter connected in series with said CTD to provide a dispersion corrected output of the data from said CTD,
   e. means for selectively applying said dispersion corrected output to the input of said CTD at said high data rate,
   f. a data display unit,
   g. means for applying said dispersion corrected output to said display unit at said high data rate, and
   h. means for periodically reloading said CTD at said low rate.

8. The combination set forth in claim 7 in which said transversal filter comprises a terminal set of cells in said CTD shift register with means to multiply outputs from said cells by weighting factors to compensate for dispersion of signals passing through said CTD analog shift register, and means to sum the results of said multiplication.

9. The combination set forth in claim 8 in which the order $k$ of correction for dispersion is about six.

10. The method of compensating dispersion in a CTD analog shift register which comprises:

a. sensing the magnitudes of successive output signal samples after each of said signal samples has completed one complete path through said analog shift register,
b. adjusting the magnitudes of said sensed signal samples by a weighting function representative of the inverse of the dispersion function of said CTD analog shift register,
c. summing the outputs resulting from each said adjustment, and
d. feeding back said respective summed outputs to the input of said analog shift register for recirculation through said shift register.

11. In the method set forth in claim 10 the step which comprises shifting the D.C. level of said output signal samples to correct for dark current produced in said CTD analog shift register.

12. In the method set forth in claim 10, the steps which comprise periodically interrupting flow of analog input data to said CTD shift register, applying a reference pulse as an input to said shift register during such interruption and adjusting the values of said weighting functions in dependence on the output from said CTD of said reference pulse and of $k-l$ trailing dispersion produced pulses.

13. In a dispersion compensated CTD controlled data display system, the combination comprising:
a. a CTD analog shift register;
b. clock means for selectively operating said shift register at low and high data rates, respectively;
c. CTD adaptive transversal filter means connected in series with said shift register and having adjustable tap weights for providing a dispersion corrected output of data from said shift register;
d. data input means selectively connectible to said shift register to input data into said shift register;
e. data display means;
f. summation means selectively connectible between the output of said transversal filter means and the output of said shift register for sensing dark current components in the output from said shift register and adjusting the D.C. level of said output from said summation means to substantially eliminate said dark current component from the output of said shift register;
g. dispersion correction means selectively connectible to said shift register and transversal filter means to apply to the input of said shift register a known amplitude pulse and means automatically to set said tap weights of said transversal filter in accordance with the output from said shift register in response to said known amplitude input pulse; and
h. switch means selectively operable to
1. disconnect said data input means from said shift register, to connect said summation means to the output of said transversal filter means, and to connect said clocking means to operate said shift register at said high data rate;
2. connect said dispersion correction means to said shift register and transversal filter means;
3. connect said data input means to said shift register, and to connect said clocking means to operate said shift register at said low data rate; and
4. connect the output of said transversal filter means to said data display means and to the input of said analog shift register, and to connect said clocking means to operate said shift register at said high data rate for recirculation of data through said analog shift register at said high data rate.

* * * * *